(12) United States Patent
Du et al.

(10) Patent No.: US 9,885,925 B2
(45) Date of Patent: Feb. 6, 2018

(54) TFT SUBSTRATES AND LIQUID CRYSTAL PANELS

(71) Applicant: Shenzhen China Star Optoelectronics Technology Co., Ltd., Shenzhen, Guangdong (CN)

(72) Inventors: Peng Du, Guangdong (CN); Ming-hung Shih, Guangdong (CN); Chih-tsung Kang, Guangdong (CN); Je-hao Hsu, Guangdong (CN); Qibiao Lv, Guangdong (CN); Xiaohui Yao, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 105 days.

(21) Appl. No.: 14/780,623

(22) PCT Filed: Jul. 23, 2015

(86) PCT No.: PCT/CN2015/084898
§ 371 (c)(1),
(2) Date: Sep. 28, 2015

(87) PCT Pub. No.: WO2017/008325
PCT Pub. Date: Jan. 19, 2017

(65) Prior Publication Data
US 2017/0153505 A1  Jun. 1, 2017

(30) Foreign Application Priority Data

Jul. 13, 2015 (CN) .......................... 2015 1 0410366

(51) Int. Cl.
*H01L 27/14* (2006.01)
*G02F 1/1343* (2006.01)
(Continued)

(52) U.S. Cl.
CPC ...... *G02F 1/134309* (2013.01); *G02F 1/1368* (2013.01); *G02F 1/136213* (2013.01); *G02F 1/136286* (2013.01); *H01L 27/124* (2013.01); *H01L 27/1255* (2013.01); *G02F 2001/134345* (2013.01); *G02F 2201/121* (2013.01); *G02F 2201/123* (2013.01)

(58) Field of Classification Search
USPC ...................................................... 257/72, 71
See application file for complete search history.

(56) References Cited

U.S. PATENT DOCUMENTS

2013/0002738 A1* 1/2013 Lu .................. G09G 3/3648
345/694
2016/0358983 A1* 12/2016 Shi .................. H01L 27/3209

\* cited by examiner

*Primary Examiner* — Timor Karimy
(74) *Attorney, Agent, or Firm* — Andrew C. Cheng

(57) ABSTRACT

In the present disclosure, one TFT substrate and a liquid crystal panel are disclosed. The TFT substrate includes a plurality of pixel cells, and each of the pixel cells includes three sub-pixel cells. Within one pixel cell, at least one sub-pixel includes single pixel area. Each of the other pixel cells includes two isolated pixel areas, and brightness of the at least two isolated pixel areas being different. In view of the above, the performance of the liquid crystal panel is enhanced when the viewing angle is large. In addition, the transmission rate of the liquid crystal panel may be maintained to be higher, which saves the power consumption of the backlight module so as to save the energy.

16 Claims, 5 Drawing Sheets

(51) Int. Cl.
*G02F 1/1368* (2006.01)
*G02F 1/1362* (2006.01)
*H01L 27/12* (2006.01)

TFT SUBSTRATES AND LIQUID CRYSTAL PANELS

BACKGROUND OF THE INVENTION

1. Field of the Invention

The present disclosure relates to liquid crystal display technology, and more particularly to a TFT substrate and a liquid crystal panel.

2. Discussion of the Related Art

Color shift is a common issue for the liquid crystal panel when the viewing angle is large. A conventional way to resolve this issue is to divide each of the sub-pixel cell into two areas, including a main pixel area and a secondary pixel area. During operation, the brightness of the main pixel area is greater than that of the secondary pixel area, which enhances the performance of the liquid crystal panel. Usually, the dimensional of the secondary pixel area is configured to be larger, which is around 60% of the aperture area of the secondary pixel cell. This reduces the transmission rate of the overall secondary pixel cell. In order to maintain a higher transmission rate, the power consumption of the backlight module has to be increased, which results in energy waste.

Thus, a new technical solution is described in the present disclosure. Each of the pixels includes red, green, and blue sub-pixels. Only one or two of the sub-pixels may include two areas. The brightness of the two areas are different when the grayscale level is the same. The two sub-pixels are configured to enhance the performance of the liquid crystal panel when the viewing angle is large. Other sub-pixels include single area. In one aspect, there will be no Sub-area with lower brightness. On the other hand, the aperture rate may not be reduced due to the partitions of the pixels. Thus, the transmission rate of the liquid crystal panel is enhanced, which ensures the environmental compliance of the products.

SUMMARY

The object of the invention is to provide a TFT substrate and a liquid crystal panel for remaining a transmission rate of the liquid crystal panel under a large-viewing-angle condition so as to save the energy.

In one aspect, a TFT substrate includes: a plurality of pixel cells, each of the pixel cells including three sub-pixel cells, wherein within one pixel cell, at least one sub-pixel including single pixel area, and each of the other pixel cells including two isolated pixel areas, including a main pixel area and a secondary pixel area, brightness of the main pixel area is greater than the brightness of the secondary pixel area, a dimension of the main pixel area to the dimension of the secondary pixel area being in a range between 1:1 and 1:6, and the brightness of the main pixel area is greater than or equal to the brightness of the sub-pixel cell of the single pixel area.

Wherein the TFT substrate includes a voltage reduction component and a plurality of data lines parallel to each other, wherein a main pixel electrode of the main pixel area and a secondary pixel electrode of the secondary pixel area connect to the same data line such that a voltage is provided by the same data line, the voltage of the secondary pixel electrodes is reduced by the voltage reduction component, and the voltage of the main pixel electrode is greater than the voltage of the secondary pixel electrode such that the brightness of the main pixel area is greater than the brightness of the secondary pixel area.

In another aspect, a TFT substrate includes: a plurality of pixel cells, each of the pixel cells including three sub-pixel cells, wherein within one pixel cell, at least one sub-pixel including single pixel area, and each of the other pixel cells including two isolated pixel areas, and brightness of the at least two isolated pixel areas being different.

Wherein within each of the pixel cells, one of the sub-pixel cells includes at least two isolated pixel areas.

Wherein within each of the pixel cells, two of the sub-pixel cells comprise at least two isolated pixel areas.

Wherein each of the other sub-pixel cells includes two isolated pixel areas, including a main pixel area and a secondary pixel area, the brightness of the main pixel area is greater than the brightness of the secondary pixel area, and a dimension of the main pixel area to the dimension of the secondary pixel area is in a range between 1:1 and 1:6.

Wherein the TFT substrate includes a voltage reduction component and a plurality of data lines parallel to each other, wherein a main pixel electrode of the main pixel area and a secondary pixel electrode of the secondary pixel area connect to the same data line such that a voltage is provided by the same data line, the voltage of the secondary pixel electrodes is reduced by the voltage reduction component, and the voltage of the main pixel electrode is greater than the voltage of the secondary pixel electrode such that the brightness of the main pixel area is greater than the brightness of the secondary pixel area.

Wherein the TFT substrate further includes scanning lines and at least one common electrode, the voltage reduction component is a transistor, an input end of the transistor electrically connects to the secondary pixel electrodes, an output end of the transistor electrically connects to the common electrode, a control end of the transistor electrically connects to the scanning line, when the data line provides the voltage to the main pixel electrodes and the secondary pixel electrodes, the control end receives scanning driving signals provided by the scanning line such that the input end and the output end are connected, and the secondary pixel electrodes is discharged due to electrical connection with the common electrode such that the voltage is reduced.

Wherein the TFT substrate further includes scanning lines and at least one common electrode, the voltage reduction component is a transistor and an coupling capacitor, an input end of the transistor electrically connects to the secondary pixel electrodes, an output end of the transistor electrically connects to the coupling capacitor, a control end of the transistor electrically connects to the scanning line, the coupling capacitor further electrically connects to the common electrode, when the data line provides the voltage to the main pixel electrodes and the secondary pixel electrodes, the control end receives scanning driving signals provided by the scanning line such that the input end and the output end are connected, the secondary pixel electrodes is coupled with the common electrode via the coupling capacitor such that the voltage is reduced.

Wherein the voltage reduction component includes an coupling capacitor electrically connecting to the data line and the secondary pixel electrodes respectively, the voltage provided by the data line is coupled with the secondary pixel electrodes via the coupling capacitor such that the voltage is reduced.

Wherein the TFT substrate includes a plurality of data lines parallel to each other, the main pixel electrodes of the main pixel area and the secondary pixel electrodes of the secondary pixel area respectively receives the voltage provided by two different data lines, wherein the voltage received by the main pixel electrodes is greater than the voltage received by the secondary pixel electrodes such that the brightness of the main pixel area is greater than the brightness of the secondary pixel area.

In another aspect, a liquid crystal panel includes: a TFT substrate including a plurality of pixel cells, each of the pixel cells including three sub-pixel cells, wherein within one pixel cell, at least one sub-pixel including single pixel area, and each of the other pixel cells including two isolated pixel areas, and brightness of the at least two isolated pixel areas being different.

Wherein within each of the pixel cells, one of the sub-pixel cells includes at least two isolated pixel areas.

Wherein within each of the pixel cells, two of the sub-pixel cells comprise at least two isolated pixel areas.

Wherein each of the other sub-pixel cells includes two isolated pixel areas, including a main pixel area and a secondary pixel area, the brightness of the main pixel area is greater than the brightness of the secondary pixel area, and a dimension of the main pixel area to the dimension of the secondary pixel area is in a range between 1:1 and 1:6

Wherein the TFT substrate includes a voltage reduction component and a plurality of data lines parallel to each other, wherein a main pixel electrode of the main pixel area and a secondary pixel electrode of the secondary pixel area connect to the same data line such that a voltage is provided by the same data line, the voltage of the secondary pixel electrodes is reduced by the voltage reduction component, and the voltage of the main pixel electrode is greater than the voltage of the secondary pixel electrode such that the brightness of the main pixel area is greater than the brightness of the secondary pixel area.

Wherein the TFT substrate further includes scanning lines and at least one common electrode, the voltage reduction component is a transistor, an input end of the transistor electrically connects to the secondary pixel electrodes, an output end of the transistor electrically connects to the common electrode, a control end of the transistor electrically connects to the scanning line, when the data line provides the voltage to the main pixel electrodes and the secondary pixel electrodes, the control end receives scanning driving signals provided by the scanning line such that the input end and the output end are connected, and the secondary pixel electrodes is discharged due to electrical connection with the common electrode such that the voltage is reduced.

Wherein the TFT substrate further includes scanning lines and at least one common electrode, the voltage reduction component is a transistor and an coupling capacitor, an input end of the transistor electrically connects to the secondary pixel electrodes, an output end of the transistor electrically connects to the coupling capacitor, a control end of the transistor electrically connects to the scanning line, the coupling capacitor further electrically connects to the common electrode, when the data line provides the voltage to the main pixel electrodes and the secondary pixel electrodes, the control end receives scanning driving signals provided by the scanning line such that the input end and the output end are connected, the secondary pixel electrodes is coupled with the common electrode via the coupling capacitor such that the voltage is reduced.

Wherein the voltage reduction component includes an coupling capacitor electrically connecting to the data line and the secondary pixel electrodes respectively, the voltage provided by the data line is coupled with the secondary pixel electrodes via the coupling capacitor such that the voltage is reduced.

Wherein the TFT substrate includes a plurality of data lines parallel to each other, the main pixel electrodes of the main pixel area and the secondary pixel electrodes of the secondary pixel area respectively receives the voltage provided by two different data lines, wherein the voltage received by the main pixel electrodes is greater than the voltage received by the secondary pixel electrodes such that the brightness of the main pixel area is greater than the brightness of the secondary pixel area.

In view of the above, for each of the pixel cells, at least one sub-pixel cells includes single pixel area, and each of the other sub-pixel cells is configured to include two pixel areas, and the brightness of the two isolated pixel areas are different. In this way, the large-viewing-angle characteristics of the liquid crystal panel may be enhanced. In addition, at least one of the sub-pixel cells includes single pixel area, that is, the sub-pixel is not partitioned. Thus, the transmission rate of the liquid crystal panel may be maintained to be higher, which saves the power consumption of the backlight module so as to save the energy.

DETAILED DESCRIPTION OF THE EMBODIMENTS

Embodiments of the invention will now be described more fully hereinafter with reference to the accompanying drawings, in which embodiments of the invention are shown.

Figure 1:
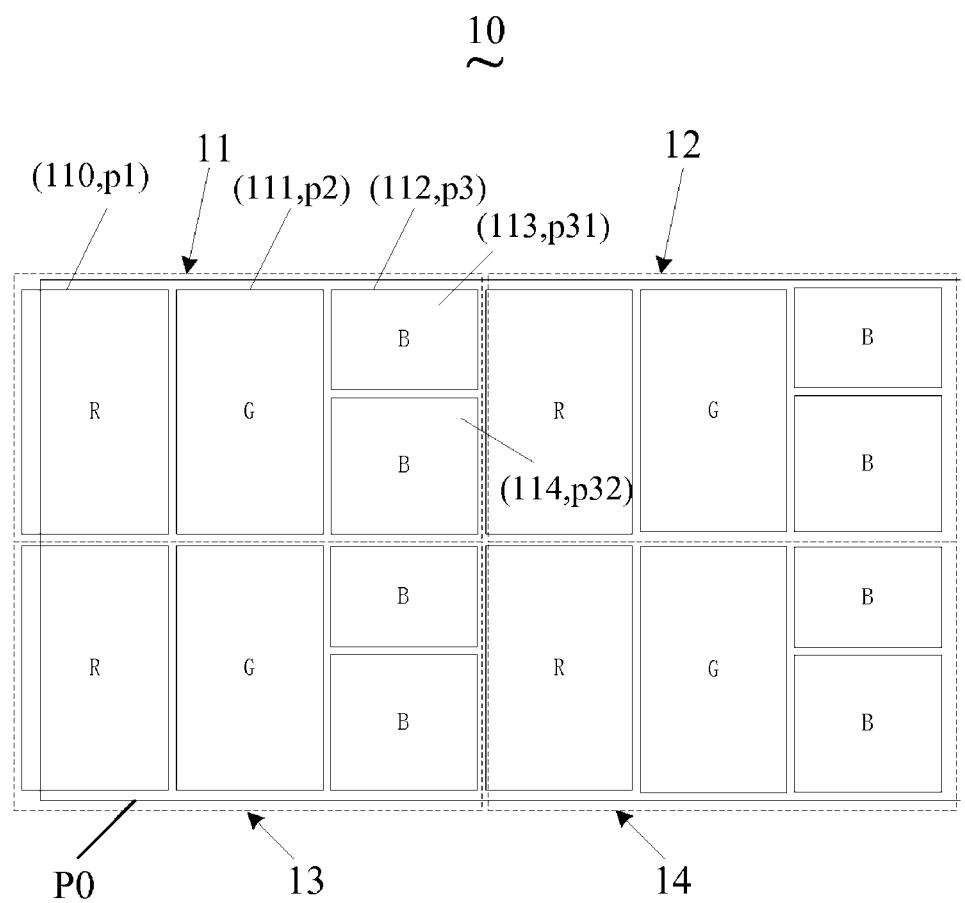
FIG. 1 is a schematic view of the TFT substrate in accordance with one embodiment.

FIG. 1 is a schematic view of the TFT substrate in accordance with one embodiment. As shown in FIG. 1, the thin film transistor (TFT) substrate 100 includes a plurality of pixel cells, such as the pixel cells 11, 12, 13, 14 in FIG. 1. Each of the pixel cells includes three sub-pixel cells. As shown in FIG. 1, the pixel cell 11 includes sub-pixel cells 110, 111, and 112 respectively displaying red (R), green (G), and blue (B).

With respect to one pixel cell, at least one of the pixel cell includes single pixel area, and each of the other sub-pixel cells includes two isolated pixel areas. In addition, the brightness of the two isolated pixel areas are different. Taking the pixel cell 11 in FIG. 1 as one example, within the pixel cell 11, the sub-pixel cells 110, 111 are single pixel areas, wherein no partitions are configured therein. The sub-pixel cell 112 includes two isolated pixel areas, which are respectively a main pixel area 113 and a secondary pixel area 114. The brightness of the main pixel area 113 and the secondary pixel area 114 are different.

Thus, the pixel cell includes sub-pixel cell 112 having different areas configured with different brightness. Thus, the sub-pixel cell 112 may be configured to improve the performance of the liquid crystal panel composed by the TFT substrate 10 when the viewing angle is large. Further, with respect to the pixel cell, the sub-pixel cell 110, 111 are single pixel areas, which guarantee a higher transmission rate. In this way, the power consumption of the backlight module is saved.

In the embodiment, with respect one pixel cell, the sub-pixel preferably includes two isolated pixel areas, as shown in FIG. 1. In addition, the number of the sub-pixel configured to include two isolated pixel areas equals to one or two. FIG. 1 and the above disclosure relate to the scenario wherein the number of sub-pixel configured to include two isolated pixel areas equals to one.

It is to be noted that, in other embodiments, the sub-pixel cells 110, 111 may be respectively configured to include two isolated pixel areas.

Figure 2:
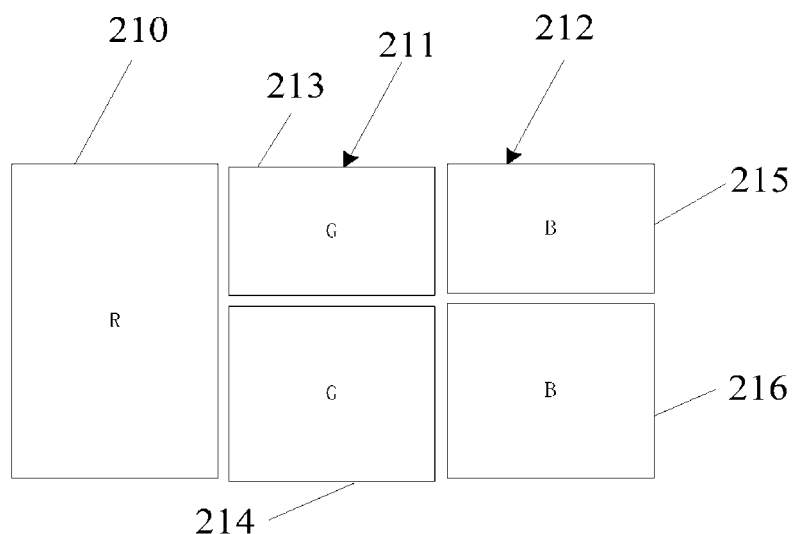
FIG. 2 is another schematic view of one pixel cell of FIG. 1.

FIG. 2 shows the conditions when the number of the sub-pixel configured to include two isolated pixel areas equals to two. FIG. 2 is another schematic view of one pixel cell of FIG. 1.

As shown in FIG. 2, the sub-pixel 210 of the pixel cell 21 is a single pixel area. The sub-pixel cells 211, 212 respectively includes two isolated pixel areas. Specifically, the sub-pixel cell 211 includes a main pixel area 213 and a secondary pixel area 214. The sub-pixel cell 212 includes a main pixel area 215 and a secondary pixel area 216. The brightness of the main pixel area 213 and the secondary pixel area 214 are different. In addition, the brightness of the main pixel area 215 and the secondary pixel area 216 are different.

It is to be noted that, in other embodiments, the sub-pixel cells 210, 211 may respectively include two pixel areas. Alternatively, the sub-pixel cells 210, 211 may respectively include two pixel areas. The configuration is shown in FIG. 2, and thus will be omitted hereinafter.

With respect to the main pixel area and the secondary pixel area, preferably, the brightness of the main pixel area is greater than that of the secondary pixel area. The dimension of the main pixel area to that of the secondary pixel area is in a range between 1:1 and 1:6. The process of configuring the brightness of the main pixel area to be greater than that of the secondary pixel area will be described hereinafter.

The brightness of the main pixel area is greater than or equal to the brightness of the sub-pixel cell of the single pixel area. As shown in FIG. 1, in an example, the brightness of the main pixel area 113 is greater than or equal to the brightness of the pixel cells 110, 111. In view of the above, the brightness of the main pixel area is greater than that of the secondary pixel area. In addition, only one or two sub-pixel cell of the pixel cell may be configured to be partitioned. As shown in FIG. 1, only the sub-pixel 112 of the pixel cell 11 is configured to be partitioned. Compared to conventional design, the dimension of the secondary pixel area having a lower brightness has been reduced for a ratio 2/3. Thus the brightness of the liquid crystal panel has been improved, and so does the transmission rate. Further, referring to the pixel cell 21 shown in FIG. 2, only two sub-pixel cells 211, 212 are configured to be partitioned. Compared to the conventional design of FIG. 1, the dimension of the secondary pixel area having lower brightness has been reduced for a ratio of 1/3. Thus, the brightness of the liquid crystal panel may be enhanced, and so does the transmission rate.

In view of the above, for each of the pixel cells, one or two sub-pixel cells are configured to include two pixel areas. In real scenario, one sub-pixel cell may be configured to include more than two pixel areas.

Further, the number of the sub-pixel cells within each partition of the pixel cells may be configured in accordance with the locations of the pixel cells. Yet in another example, the number of the partitions of the sub-pixel cells may be configured in accordance with the locations of the pixel cells.

Specifically, the number of the sub-pixel cells having at least two pixel areas are different for the pixel cells in different location. For instance, in a central location of the TFT substrate 10, two sub-pixel cells of each of the pixel cells are single areas, and the other sub-pixel cells may include at least two pixel areas. In a rim of the TFT substrate 10, one sub-pixel cell of each of the pixel cells is one single area, and the other two sub-pixel cells may include at least two pixel areas.

Similarly, for the pixel cells in different locations, the numbers of the pixel areas contained by the sub-pixel cells having partitions are different. For instance, in the central location of the TFT substrate 10, one sub-pixel cell of each of the pixel cells includes two pixel areas. In the rim of the TFT substrate 10, one sub-pixel cell of each of the pixel cells includes at least two pixel areas.

It can be understood that the above two configurations may be combined together. That is, for the pixel cells in different locations, the numbers of the sub-pixel cells having two pixel areas are different, and the numbers of partitions configured in the sub-pixel cells are different. For instance, in the central location of the TFT substrate 10, for each of the pixel cells, one sub-pixel cell includes two pixel areas. In the rim of the TFT substrate 10, for each of the pixel cells, two sub-pixel cells include at least two pixel areas.

In addition, the brightness difference between the main pixel area and the secondary pixel area of the pixel cell may be configured in accordance with the locations of the pixel cell. For instance, in the central location of the TFT substrate 10, the brightness difference may be configured to be smaller. In the rim of the TFT substrate 10, the brightness difference may be configured to be larger.

The above disclosure relates to the partitions of the three sub-pixel cells, including R (red), G (green) and B (blue). In other embodiments, each of the pixel cells may include R, G, B and W (white) four sub-pixel cells. The partitions of the sub-pixel cells may be configured in a way similar to the conditions when the pixel cell includes three sub-pixel cells.

Figure 3:
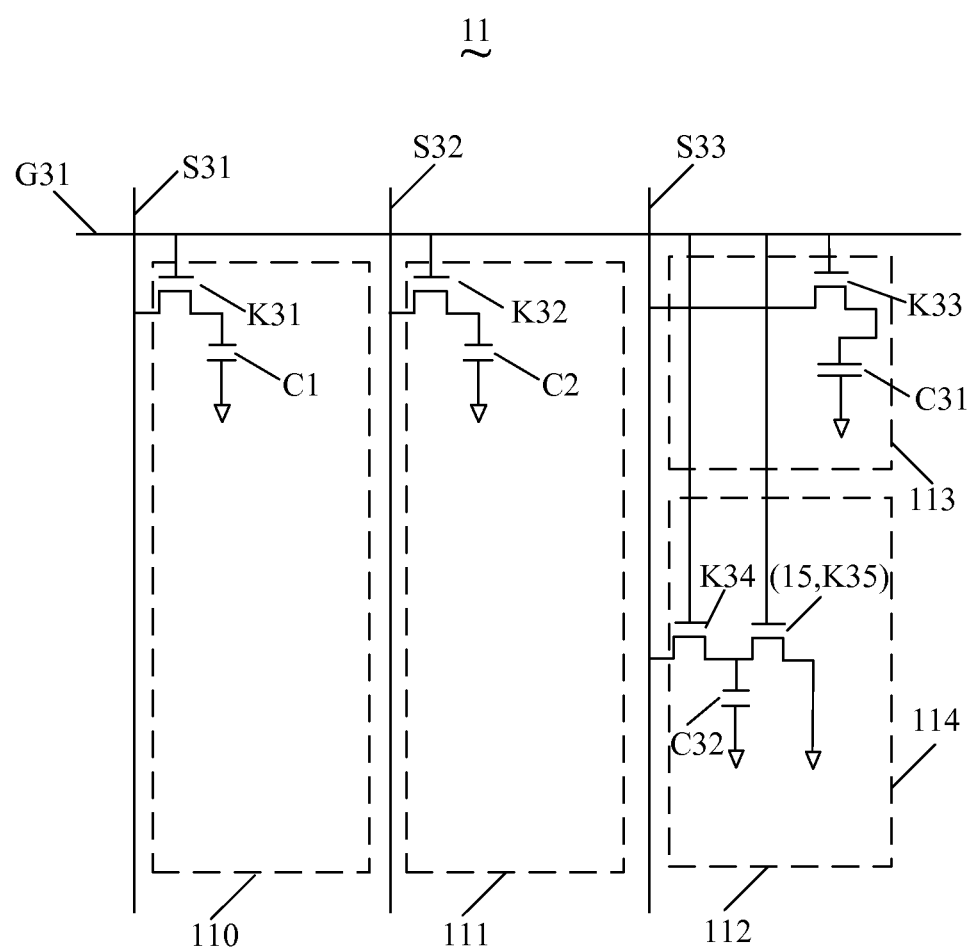
FIG. 3 is a circuit diagram of the TFT substrate in accordance with one embodiment.

Referring to FIGS. 1 and 3, FIG. 3 is a circuit diagram of the TFT substrate in accordance with one embodiment. FIG. 3 only shows the circuit structure of the pixel cell 11 shown in FIG. 1. It can be understood that the circuit structure of other pixel cells are similar to that of the pixel cell 11. As shown in FIG. 3, the TFT substrate 10 includes a plurality of data lines S31, S32, S33 parallel to each other, scanning lines G31 (only one scanning line is shown in FIG. 3), at least one common electrode P0, pixel electrodes P1, P2, P3 respectively arranged within the sub-pixels 110, 111, 112, and transistors K31, K32, and K33 arranged within the sub-pixel cells 110, 111, 112. The control ends of the transistors K31, K32, and K33 electrically connect to the scanning lines G31. The input ends of the transistors K31, K32, and K33 electrically connect to the data lines S31, S32, S33, respectively. The output ends of the transistors K31, K32, and K33 electrically connect to the pixel electrodes P1, P2, P3 of the sub-pixel cells 110, 111, and 112, respectively. It is to be noted that for the sub-pixel cell 112 having two pixel areas, the output end of the transistor K33 connects to the main pixel electrodes P31 of the main pixel area 113.

When the scanning line G31 provides scanning driving signals to the transistors K31, K32, K33, the input ends and the output ends of the transistors K31, K32, K33 are connected. The data lines S31, S32, and S33 respectively charges the pixel electrodes P1, P2 of the sub-pixel cells 110, 111 and the main pixel electrode P31 of the main pixel area 113. As such, the pixel electrodes P1, P2 and the main pixel electrodes P31 respectively form storage capacitors C1, C2 and C31 with the common electrode P0.

Further, the TFT substrate 10 includes a transistor K32 and a voltage reduction component 15. The control end and the input end of the transistor K32 electrically connect to the scanning line G31 and the data line S33. The output end of the transistor K34 electrically connects the secondary pixel electrodes P32 of the secondary pixel area such that the secondary pixel area P32 and the common electrode P0 form the storage capacitor C32 when the data line S33 charges the secondary pixel electrode P32. Within the sub-pixel cell 112, the main pixel electrodes P31 of the main pixel area 113 and the secondary pixel electrode P32 of the secondary pixel area 114 electrically connect to the same data line S33 such that the voltage is provided by the same data line S33. Further, the voltage of the secondary pixel electrode P32 of the secondary pixel area 114 may be reduced by the voltage reduction component 15 such that the voltage of the main pixel electrode P31 is greater than the voltage of the secondary pixel electrode P32, which results in that the brightness of the main pixel area 113 is greater than the brightness of the secondary pixel area 114. Configuring the brightness of the main pixel area 113 to be greater than that of the secondary pixel area 114 via the voltage reduction component 15 may include three configurations below.

The first configuration may be described in accordance with FIG. 3. Within the sub-pixel cell 112, the voltage reduction component 15 may include the transistor K35. The input end of the transistor K35 electrically connects the secondary pixel electrode P32. The output end of the transistor K35 electrically connects the common electrode P0. The control end of the transistor K35 electrically connects the scanning line G31. That is, when the scanning line G31 provides the scanning driving signals to the transistors K33, K34, the data line S33 provides the voltage to the main pixel electrode P31 and the secondary pixel electrode P32. The control end of the transistor K35 receives the scanning driving signals provided by the scanning line G31 at the same time. As such, the input end and the output end of the transistor K35 are connected such that the secondary pixel electrode P32 is discharged by electrically connecting the transistor K35 and the common electrode P0. In this way, the level of the secondary pixel electrode P32 and the main pixel electrode P31 may be close to the level of the common electrode P0 such that the voltage is reduced. During normal operations of the TFT substrate 10, the brightness of the secondary pixel area 114 may be lower. In this way, the sub-pixel cell 112 may be configured to enhance the performance of the liquid crystal panel when the viewing angle is large. In addition, the pixel cells 110, 111 may be configured to maintain high transmission rate of the liquid crystal panel.

Figure 4:
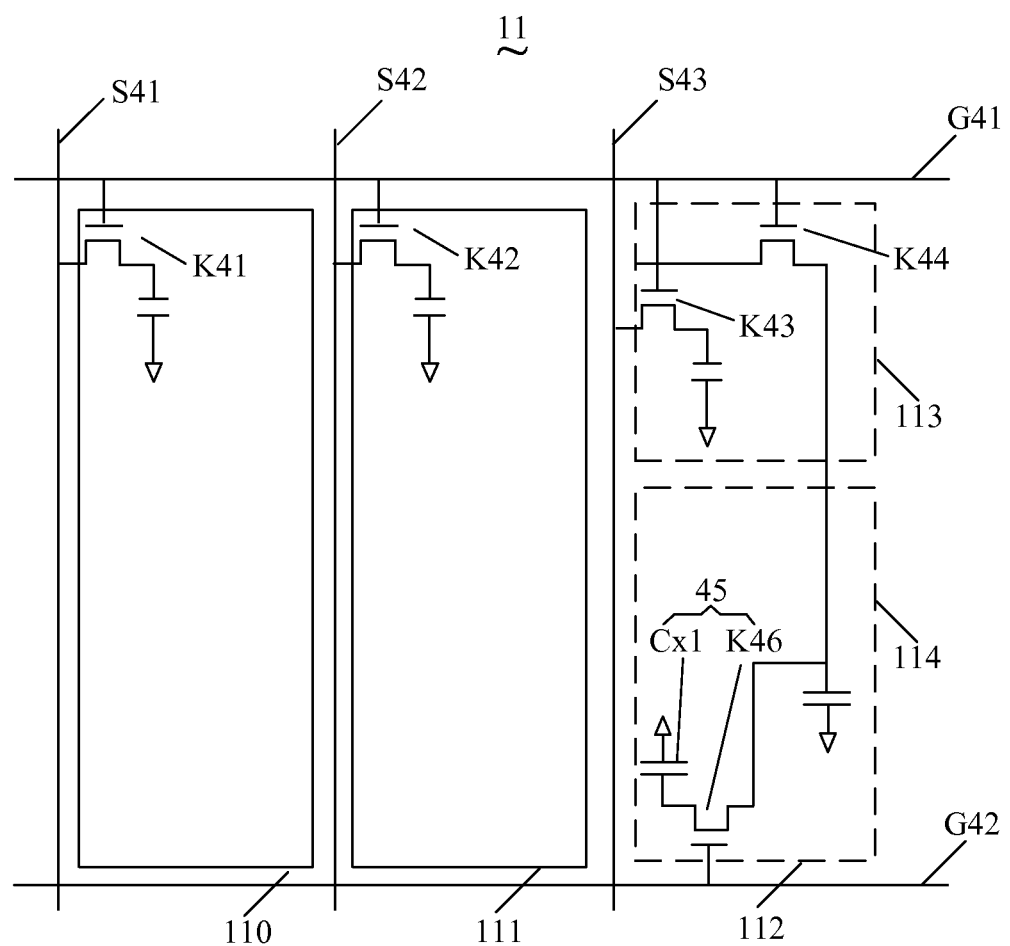
FIG. 4 is a circuit diagram of the TFT substrate in accordance with another embodiment.

The second configuration may be described in accordance with FIGS. 1 and 4. FIG. 4 is a circuit diagram of the TFT substrate in accordance with another embodiment. FIG. 4 only shows the circuit structure of the pixel cell 11 shown in FIG. 1. It can be understood that the circuit structure of other pixel cells are similar to that of the pixel cell 11. As shown in FIG. 4, the TFT substrate 10 includes a plurality of data lines S41, S42, S43 parallel to each other, scanning lines G41, G42, corresponding sub-pixel cells 110, 112, and the transistors K41, K42, K43. The connection relationship of the data lines S41, S42, S43, the scanning line G41, and the transistors K31, K32, K33 is similar to the connection relationship of the data lines S31, S32, S33, the scanning line G31, and the transistor K31, K32, and K33 of FIG. 3.

The difference between FIGS. 4 and 3 resides in that the voltage reduction component 45 of FIG. 4 includes the transistor K45 and an coupling capacitor (Cx1). The input end of the transistor K45 electrically connects to the secondary pixel electrode P32 of the secondary pixel area 114. The output end of the transistor K45 electrically connects the coupling capacitor (Cx1). The control end of the transistor K45 electrically connects the scanning line G42. The coupling capacitor (Cx1) electrically connects with the common electrode P0. It is to be noted that the scanning driving signals provided by the scanning line G42 has a lag than the scanning driving signals provided by the scanning line G41. Referring to the sub-pixel cell 112 of FIG. 4, the scanning line G41 provides the scanning driving signals to the transistors K43, K44. After the data line S43 provides the voltage to the main pixel electrode P31 and the secondary pixel electrode P32, the scanning line G42 provides the scanning driving signals to the transistor K45. That is, the control end of the transistor K45 receives the scanning driving signals provided by the scanning line G42 such that the input end and the output end of the transistor K45 are connected. In this way, the level of the secondary pixel electrode P32 is close to the level of the common electrode P0 due to the secondary pixel electrode P32 is coupled with the common electrode P0 via the coupling capacitor (Cx1). Thus, the voltage is reduced.

Figure 5:
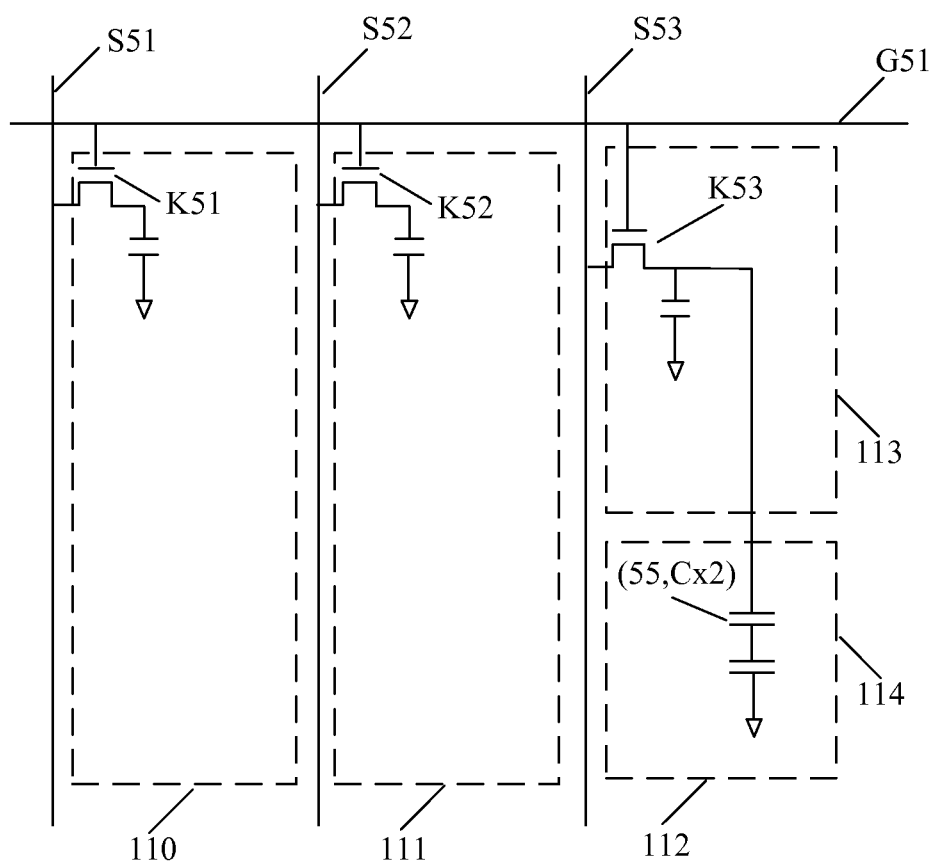
FIG. 5 is a circuit diagram of the TFT substrate in accordance with another embodiment.

The third configuration may be described in accordance with FIGS. 1 and 5. FIG. 5 is a circuit diagram of the TFT substrate in accordance with another embodiment. FIG. 5 only shows the circuit structure of the pixel cell 11 shown in FIG. 1. It can be understood that the circuit structure of other pixel cells are similar to that of the pixel cell 11.

As shown in FIG. 5, the TFT substrate 10 includes a plurality of data lines S51, S52, S53 parallel to each other, the scanning line G51, corresponding sub-pixel cells 110, 111, 112, and transistors K51, K52, K53. The connection relationship of the data lines S51, S52, S53, the scanning line G51, and the transistors K51, K52 is similar to the connection relationship of the data lines S41, S42, S43, the scanning line G41, and the transistor K41, K42 of FIG. 4.

The difference between FIGS. 5 and 4 resides in that the voltage reduction component 55 of FIG. 5 is an coupling capacitor (Cx2). The coupling capacitor (Cx2) electrically connects with the data line S53 and the secondary pixel electrode P32, respectively such that the data line S53 is coupled with the secondary pixel electrode P32 via the coupling capacitor (Cx2). That is, the secondary pixel electrode P32 is charged due to the coupling effect of the coupling capacitor (Cx2). Thus, the level of the secondary pixel electrode P32 is close to the level of the common electrode P0, and thus the voltage is reduced. Compared to the main pixel electrode P31, the transmission rate of the secondary pixel electrode P32 is lower. As such, the brightness difference between the main pixel area 113 and the secondary pixel area 114 is implemented, and thus the performance of the liquid crystal panel under large viewing angle is enhanced.

Specifically, the control end of the transistor K53 electrically connects with the scanning line G51, and the input end of the transistor K53 electrically connects with the data line S53. The output end not only electrically connects with the main pixel electrode P31, but also electrically connects with one electrode of the coupling capacitor (Cx2). The other electrode of the coupling capacitor (Cx2) electrically connects with the secondary pixel electrode P32. Thus, when the scanning line G51 provides the scanning driving signals to the transistor K53, the input end and the output end of the transistor K53 are connected such that the transistor K53 respectively provides the voltage to the main pixel electrode P31, the coupling capacitor (Cx2), and the secondary pixel electrode P32. As the coupling capacitor (Cx2) is coupled between the output end of the transistor K53 and the secondary pixel electrode P32, the coupling capacitor (Cx2) reduces the voltage received by the secondary pixel electrode P32.

In view of the above, the above configuration may be simply driven by providing the voltage to the main pixel electrodes and the secondary pixel electrodes via one data line. In another example, two different data lines may be configured to provide different voltage for the mina pixel electrodes and the secondary pixel electrodes.

Figure 6:
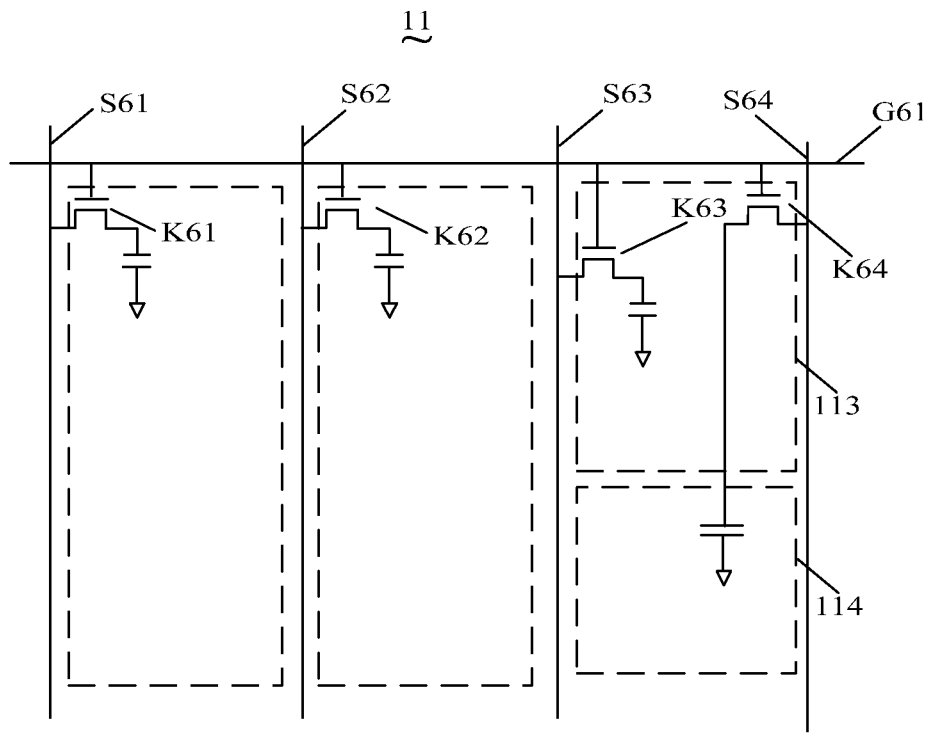
FIG. 6 is a circuit diagram of the TFT substrate in accordance with another embodiment.

Referring to FIGS. 1 and 6, FIG. 6 is a circuit diagram of the TFT substrate in accordance with another embodiment. FIG. 6 only shows the circuit structure of the pixel cell 11 shown in FIG. 1. It can be understood that the circuit structure of other pixel cells are similar to that of the pixel cell 11. As shown in FIG. 6, the TFT substrate 10 includes a plurality of data lines S61, S62, S63 parallel to each other, scanning lines G61, corresponding sub-pixel cells 110, 111, 112, and the transistor K63. The connection relationship of the data lines S61, S62, S63, the scanning line G61, and the transistors K61, K62, K63 is similar to the connection relationship of the data lines S31, S32, S33, the scanning line G31, and the transistor K31, K32, and K33 of FIG. 3.

The difference between FIGS. 6 and 3 resides in that the main pixel electrode P31 and the secondary pixel electrode P32 of FIG. 6 respectively receives the voltage provided by two different data lines. The voltage received by the main pixel electrode P31 is larger than the voltage received by the secondary pixel electrode P32 such that the brightness of the main pixel area 113 is greater than that of the secondary pixel area 114.

Specifically, the TFT substrate 10 of FIG. 6 further includes the transistor K64. The control end of the transistor K64 connects to the scanning line G61, the input end of the transistor K64 connects to the data line S64, and the output end of the transistor K64 connects to the secondary pixel electrode P32. The voltage provided by the data line S63 is greater than the voltage provided by the data line S64 such that the voltage received by the main pixel electrode P31 is greater than the voltage received by the secondary pixel electrode P32 such that the brightness of the main pixel area 113 is greater than that of the secondary pixel area 114.

In view of FIG. 6, the brightness of the main pixel area 113 may be configured to be greater than that of the secondary pixel area 114 by adopting only two different data lines. Not only the structure is simple and the number of the components may be reduced, but also the cost may be saved.

Figure 7:
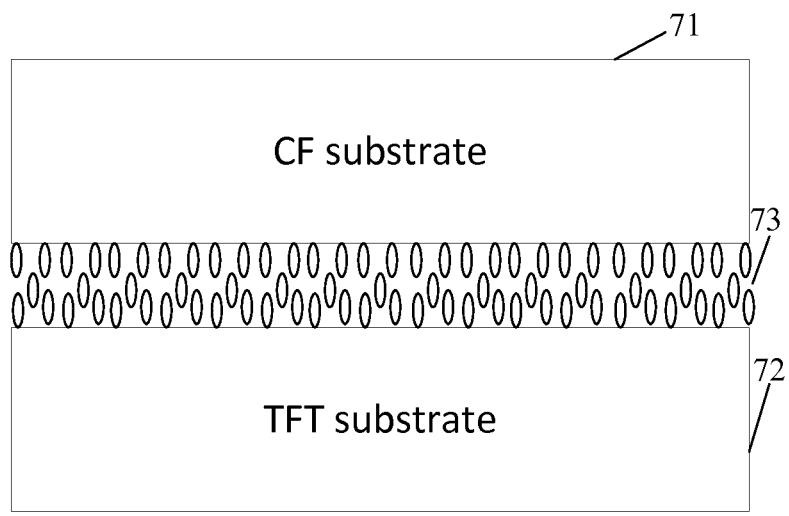
FIG. 7 is a schematic view of the liquid crystal panel in accordance with one embodiment.

FIG. 7 is a schematic view of the liquid crystal panel in accordance with one embodiment. The liquid crystal panel 70 may include a color filter (CF) substrate 71, a TFT substrate 72, and a liquid crystal layer 73 between the CF substrate 71 and the TFT substrate 72. The TFT substrate 72 may be the above-mentioned TFT substrate 10. The CF substrate 71 includes a plurality of photoresist areas (not shown) corresponding to the sub-pixel cells on the TFT substrate 72.

In view of the above, the pixel cells includes the sub-pixel cells with partitions, and the brightness of different pixel areas may be configured to be different, which may enhance the performance of the liquid crystal panel formed by the TFT substrate 10 when the viewing angle is large. In addition, within the pixel cell, at least one sub-pixel cell includes single pixel area. That is, the sub-pixel cell has not been partitioned. In this way, the transmission rate of the liquid crystal panel may be maintained to be higher, which saves the power consumption of the backlight module so as to save the energy.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A thin film transistor (TFT) substrate, comprising: a plurality of pixel cells, each of the pixel cells comprising three sub-pixel cells having the same dimension, wherein within one pixel cell, at least one sub-pixel comprising single pixel area, and each of the other sub-pixels comprising two isolated pixel areas comprising a main pixel area and a secondary pixel area, the brightness of the main pixel area is greater than the brightness of the secondary pixel area, and a dimension of the main pixel area to the dimension of the secondary pixel area is in a range between 1:1 and 1:6.

2. The TFT-substrate as claimed in claim 1, wherein within each of the pixel cells, one of the sub-pixel cells comprises at least two isolated pixel areas.

3. The TFT-substrate as claimed in claim 1, wherein within each of the pixel cells, two of the sub-pixel cells comprise at least two isolated pixel areas.

4. The TFT-substrate as claimed in claim 3, wherein the TFT substrate comprises a voltage reduction component and a plurality of data lines parallel to each other, wherein a main pixel electrode of the main pixel area and a secondary pixel electrode of the secondary pixel area connect to the same data line such that a voltage is provided by the same data line, the voltage of the secondary pixel electrodes is reduced by the voltage reduction component, and the voltage of the main pixel electrode is greater than the voltage of the secondary pixel electrode such that the brightness of the main pixel area is greater than the brightness of the secondary pixel area.

5. The TFT-substrate as claimed in claim 4, wherein the TFT substrate further comprises scanning lines and at least one common electrode, the voltage reduction component is a transistor, an input end of the transistor electrically connects to the secondary pixel electrodes, an output end of the transistor electrically connects to the common electrode, a control end of the transistor electrically connects to the scanning line, when the data line provides the voltage to the main pixel electrodes and the secondary pixel electrodes, the control end receives scanning driving signals provided by the scanning line such that the input end and the output end are connected, and the secondary pixel electrodes is discharged due to electrical connection with the common electrode such that the voltage is reduced.

6. The TFT-substrate as claimed in claim 4, wherein the TFT substrate further comprises scanning lines and at least one common electrode, the voltage reduction component is a transistor and an coupling capacitor, an input end of the transistor electrically connects to the secondary pixel electrodes, an output end of the transistor electrically connects to the coupling capacitor, a control end of the transistor electrically connects to the scanning line, the coupling capacitor further electrically connects to the common electrode, when the data line provides the voltage to the main pixel electrodes and the secondary pixel electrodes, the control end receives scanning driving signals provided by the scanning line such that the input end and the output end are connected, the secondary pixel electrodes is coupled with the common electrode via the coupling capacitor such that the voltage is reduced.

7. The TFT-substrate as claimed in claim 4, wherein the voltage reduction component comprises an coupling capacitor electrically connecting to the data line and the secondary pixel electrodes respectively, the voltage provided by the data line is coupled with the secondary pixel electrodes via the coupling capacitor such that the voltage is reduced.

8. The TFT-substrate as claimed in claim 1, wherein the TFT substrate comprises a plurality of data lines parallel to each other, the main pixel electrodes of the main pixel area and the secondary pixel electrodes of the secondary pixel area respectively receives the voltage provided by two different data lines, wherein the voltage received by the main pixel electrodes is greater than the voltage received by the secondary pixel electrodes such that the brightness of the main pixel area is greater than the brightness of the secondary pixel area.

9. A liquid crystal panel, comprising:
a TFT substrate comprising a plurality of pixel cells, each of the pixel cells comprising three sub-pixel cells having the same dimension, wherein within one pixel cell, at least one sub-pixel comprising single pixel area, and each of the other sub-pixels comprising two isolated pixel areas, comprising a main pixel area and a secondary pixel area, the brightness of the main pixel area is greater than the brightness of the secondary pixel area, and a dimension of the main pixel area to the dimension of the secondary pixel area is in a range between 1:1 and 1:6.

10. The liquid crystal panel as claimed in claim 9, wherein within each of the pixel cells, one of the sub-pixel cells comprises at least two isolated pixel areas.

11. The liquid crystal panel as claimed in claim 9, wherein within each of the pixel cells, two of the sub-pixel cells comprise at least two isolated pixel areas.

12. The liquid crystal panel as claimed in claim 11, wherein the TFT substrate comprises a voltage reduction component and a plurality of data lines parallel to each other, wherein a main pixel electrode of the main pixel area and a secondary pixel electrode of the secondary pixel area connect to the same data line such that a voltage is provided by the same data line, the voltage of the secondary pixel electrodes is reduced by the voltage reduction component, and the voltage of the main pixel electrode is greater than the voltage of the secondary pixel electrode such that the brightness of the main pixel area is greater than the brightness of the secondary pixel area.

13. The liquid crystal panel as claimed in claim 12, wherein the TFT substrate further comprises scanning lines and at least one common electrode, the voltage reduction component is a transistor, an input end of the transistor electrically connects to the secondary pixel electrodes, an output end of the transistor electrically connects to the common electrode, a control end of the transistor electrically connects to the scanning line, when the data line provides the voltage to the main pixel electrodes and the secondary pixel electrodes, the control end receives scanning driving signals provided by the scanning line such that the input end and the output end are connected, and the secondary pixel electrodes is discharged due to electrical connection with the common electrode such that the voltage is reduced.

14. The liquid crystal panel as claimed in claim 12, wherein the TFT substrate further comprises scanning lines and at least one common electrode, the voltage reduction component is a transistor and an coupling capacitor, an input end of the transistor electrically connects to the secondary pixel electrodes, an output end of the transistor electrically connects to the coupling capacitor, a control end of the transistor electrically connects to the scanning line, the coupling capacitor further electrically connects to the common electrode, when the data line provides the voltage to the main pixel electrodes and the secondary pixel electrodes, the control end receives scanning driving signals provided by the scanning line such that the input end and the output end are connected, the secondary pixel electrodes is coupled with the common electrode via the coupling capacitor such that the voltage is reduced.

15. The liquid crystal panel as claimed in claim 12, wherein the voltage reduction component comprises an coupling capacitor electrically connecting to the data line and the secondary pixel electrodes respectively, the voltage provided by the data line is coupled with the secondary pixel electrodes via the coupling capacitor such that the voltage is reduced.

16. The liquid crystal panel as claimed in claim 9, wherein the TFT substrate comprises a plurality of data lines parallel to each other, the main pixel electrodes of the main pixel area and the secondary pixel electrodes of the secondary pixel area respectively receives the voltage provided by two different data lines, wherein the voltage received by the main pixel electrodes is greater than the voltage received by the secondary pixel electrodes such that the brightness of the main pixel area is greater than the brightness of the secondary pixel area.

* * * * *